(12) United States Patent
Choi et al.

(10) Patent No.: US 8,822,132 B2
(45) Date of Patent: Sep. 2, 2014

(54) COLORED DISPERSION, PHOTORESIST COMPOSITION AND BLACK MATRIX

(75) Inventors: Dong-Chang Choi, Daejeon (KR);
Kyung-Soo Choi, Gyeonggi-do (KR);
Ho-Chan Ji, Daejeon (KR);
Geun-Young Cha, Daejeon (KR);
Min-Young Lim, Gyeonggi-do (KR);
Sung-Hyun Kim, Daejeon (KR);
Han-Soo Kim, Daejeon (KR);
Yoon-Hee Heo, Daejeon (KR); Ji-Heum Yoo, Daejeon (KR)

(73) Assignee: LG Chem, Ltd., Seoul (KR)

( * ) Notice: Subject to any disclaimer, the term of this patent is extended or adjusted under 35 U.S.C. 154(b) by 164 days.

(21) Appl. No.: 12/449,524

(22) PCT Filed: Nov. 10, 2008

(86) PCT No.: PCT/KR2008/006605
§ 371 (c)(1),
(2), (4) Date: Aug. 12, 2009

(87) PCT Pub. No.: WO2009/061159
PCT Pub. Date: May 14, 2009

(65) Prior Publication Data
US 2010/0104981 A1    Apr. 29, 2010

(30) Foreign Application Priority Data
Nov. 8, 2007 (KR) .................. 10-2007-0113545

(51) Int. Cl.
*G03F 7/033* (2006.01)
*C08L 37/00* (2006.01)
*C08K 5/3415* (2006.01)
*G03F 7/105* (2006.01)
*G03F 7/00* (2006.01)

(52) U.S. Cl.
CPC .............. *G03F 7/0007* (2013.01); *G03F 7/105* (2013.01); *G03F 7/033* (2013.01)
USPC .......... 430/285.1; 524/186; 524/99; 524/549; 524/88; 349/110; 430/7

(58) Field of Classification Search
None
See application file for complete search history.

(56) References Cited

U.S. PATENT DOCUMENTS

| | | | | | |
|---|---|---|---|---|---|
| 4,665,002 A | * | 5/1987 | Dan et al. | ....................... | 430/114 |
| 5,066,559 A | * | 11/1991 | Elmasry et al. | ............... | 430/115 |
| 5,952,429 A | * | 9/1999 | Ikeda et al. | ................. | 525/326.1 |
| 7,006,172 B2 | * | 2/2006 | Kawana et al. | ................. | 349/71 |
| 2006/0257763 A1 | * | 11/2006 | Araki | ................. | 430/7 |
| 2010/0085518 A1 | * | 4/2010 | Choi et al. | .................... | 349/110 |

FOREIGN PATENT DOCUMENTS

| | | |
|---|---|---|
| JP | 2002-241640 A | 8/2002 |
| JP | 2005-017441 A | 1/2005 |
| JP | 2005-141011 A | 6/2005 |
| JP | 2006-171781 A | 6/2006 |
| JP | 2006-219599 A | 8/2006 |
| JP | 2007-139991 A | 6/2007 |
| KR | 10-2004-0038687 A | 5/2004 |
| WO | WO 2007/007685 A1 | 1/2007 |

OTHER PUBLICATIONS

Billmeyer, Jr. Chapter 4 of Introduction to Polymer Science and technology: an SPE TExtbook eded by Kaufmann et al, pp. 162-197.*
Sigma-Aldrich, materials safety data sheet (MSDS) for 2-Mercaptobenzoxazole revision date Aug. 22, 2009 downloaded May 16, 2011, 5 pages.*
English translation of JP 2007-139991, A (2007) from machine translation from AIPN Japan Patent Office National Center for Industrial Property Information and Training, generated Aug. 6, 2012, 20 pages.*
English translation of JP2006-219599, A (2006) from machine translation from AIPN Japan Patent Office National Center for Industrial Property Information and Training, generated Aug. 6, 2012, 28 pages.*
English abstract and listing of compounds present set forth by Scifinder data base with respect to JP 2006-219599 publication date of Aug. 24, 2006 and Chemical abstract accession noumber of 2006:844627 and CAN 145:259400, total of 17 pages downloaded from database.*

* cited by examiner

*Primary Examiner* — Cynthia Hamilton
(74) *Attorney, Agent, or Firm* — McKenna, Long & Aldridge LLP

(57) ABSTRACT

A colored dispersion according to the present invention comprises a resin including monomers of Formulas 1 to 4, as a binder resin.
Accordingly, a photoresist composition for a black matrix of a high light shielding property, which has the dispersion stability of the colored dispersion according to the present invention, could be provided, and a black matrix of high sensibility having an uniform process characteristic while maintaining a high light-shielding property could be produced.

15 Claims, No Drawings ant issue to develop a black matrix photoresist composition, which can maintain the dispersion stability of a composition while securing a high light-shielding property, has improved adhesion to substrates and a wide development process margin, and can improve photosensitivity, as required by related companies.

COLORED DISPERSION, PHOTORESIST COMPOSITION AND BLACK MATRIX

This application is a national stage application of PCT/KR2008/006605 filed on Nov. 10, 2008, which claims the benefit of Korean Patent Application No. 10-2007-0113545 filed on Nov. 8, 2007.

TECHNICAL FIELD

The present invention relates to a colored dispersion, a photoresist composition and a black matrix. More particularly, the present invention relates to a colored dispersion to be easily applied to a large-scaled TV using a brighter backlight due to its high light-shielding property, a photoresist composition including the same and a black matrix prepared by using the same.

BACKGROUND ART

In order to improve contrast, a lattice-type black pattern, called a black matrix is generally disposed between color pixels of color filters. Chromium is used in a conventional black matrix. In this process, chromium is deposited on an entire surface of a glass substrate and a pattern is formed through an etching process, which requires high costs and causes problems, such as high reflectivity of the chromium and environmental pollution as a result of chrome-containing waste water. For this reason, various researches have been actively carried out on a resin black matrix using a pigment dispersion method in which minute processing can be performed.

Although a research has been carried out on a method of preparing a black composition using coloring pigments other than carbon black, the coloring prigments other than the carbon black have a low light shielding property, and thus, the black composition needs to contain the coloring pigments with a high mixing ratio. As a result, there occurs a problem that viscosity of the composition increases, which makes it difficult to handle the composition or decreases strength of a formed film or adhesion of the film for a substrate.

In recent years, the importance of an LCD in the field of flat displays has been rapidly increased. The region of an LCD field, which concentrates on existing small and middle-sized mobile displays or monitors, moves to the region of large-scaled monitors or TVs. As a size of glass increases, high sensitivity needs to be ensured to reduce a process time. Since brightness needs to be improved as the result of an increase in size of a screen, a backlight having more improved brightness has been adopted. As the brightness of the backlight increases, it has been required for a black matrix to have a higher light-shielding property than that in the related art. Since the content of carbon black contained in a composition is increased in order to improve a light-shielding property, there occurs a problem that a process characteristic of the black matrix according to an increase in the content has been deteriorated. Furthermore, the large quantity of carbon contained in the composition results in a tendency to seriously deteriorate dispersion stability of the composition. As a result of the deterioration of the dispersion stability, not only process characteristics for photoresist is changed but also defects in process occur, thereby causing a reduction in productivity. A deterioration in dispersion stability causes defects such as a change in coating thickness according to a change in viscosity, the deterioration of developability, the frequent occurrence of residues, projections, which are directly linked with productivity. Accordingly, it has become a major develop-

DISCLOSURE

Technical Problem

The present inventors studied the property of a binder resin used at the time of preparing a colored dispersion with respect to preparing a black matrix photoresist composition, and, as a result, found the fact that in case where a resin containing a specific monomer is used as the binder resin of a colored dispersion, it has an excellent property to maintain dispersion stability.

Accordingly, it is an object of the present invention to provide a black matrix photoresist composition for a black matrix of a high light shielding property, which has a high light-shielding property as a result of using a binder resin containing a specific monomer at the time of dispersing a coloring pigment, includes also a colored dispersing agent to maintain dispersion stability with other components, has improved adhesion to a substrate and a wide development process margin by including the colored dispersing agent, and enables to improve photosensitivity.

It is another object of the present invention to provide a black matrix which is prepared by using the photoresist composition, and to provide a liquid crystal display including the black matrix.

Technical Solution

In accordance with an aspect of the present invention, there is provided a colored dispersion comprising: a binder resin including monomers represented by the following formulas 1 to 4, and a dispersing agent and a pigment.

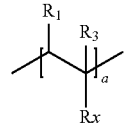

Formula 1

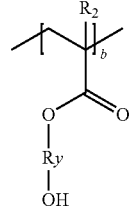

Formula 2

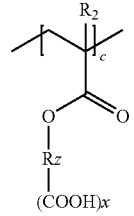

Formula 3

-continued

Formula 4

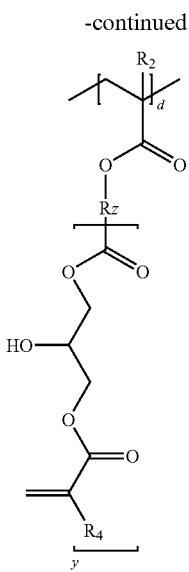

Wherein, $R_1$ represents hydrogen, or a radical, which forms an imide structure or a five-membered cyclic carboxylic anhydride with $R_x$, $R_2$ and $R_3$ are selected from the group consisting of hydrogen, methyl and hydroxyl methyl, $R_4$ represents hydrogen or a methyl group, $R_x$ is selected from the group consisting of $C_1$ to $C_{12}$ alkyl esters, $C_2$ to $C_6$ alkyl esters substituted with 1 or 2 hydroxy groups, $C_2$ to $C_6$ alkyl esters substituted with $C_1$ to $C_3$ alkoxy groups, $C_1$ to $C_6$ alkyl esters substituted with halogen groups, $C_1$ to $C_3$ alkoxy poly(n=2 to 30) alkylene, $C_2$ to $C_3$ glycol esters, $C_1$ to $C_6$ alkyl esters substituted with phenyl groups, phenyl substituted with $C_1$ to $C_6$ alkyl groups, phenyl substituted with $C_1$ to $C_6$ alkoxy groups, phenyl substituted with halogen groups, $C_1$ to $C_6$ alkoxy methyl groups, glycidoxy methyl group, $C_5$ to $C_{15}$ cyclic alkyl esters, $C_6$ to $C_{12}$ aromatic groups, and a radical that forms an imide structure or a five-membered cyclic carboxylic anhydride together with $R_1$, $R_y$ is selected from the group consisting of $C_1$ to $C_{12}$ akylenes, $C_1$ to $C_6$ alkylene groups substituted with halogen groups and $C_2$ to $C_{12}$ alkoxy poly alkylene groups, $R_z$ represets a group, which is introduced from acid anhydride, X represents 1 to 4, y represents 1 to 3, a represents 10 to 50, b represents 1 to 60, c represents 5 to 60 and d represents 1 to 70.

In a preferred embodiment, $R_z$ is a group, which is introduced from one or more acid anhydride selected from the group consisting of succinic anhydride, methyl succinic anhydride, 2,2-dimethyl succinic anhydride, isobutenyl succinic anhydride, 1,2-cyclohexane dicarboxylic anhydride, hexahydro-4-methyl phthalic anhydride, itaconic anhydride, tetrahydro phthalic anhydride, 5-norbornene-2,3-dicarboxylic anhydride, methyl-5-norbornene-2,3-dicarboxylic anhydride, 1,2,3,4-cyclobutanetetracarboxylic dianhydride, maleic anhydride, citraconic anhydride, 2,3-dimethylmaleic anhydride, 1-cyclopentene-1,2-dicarboxylic dianhydride, 3,4,5,6-tetrahydrophthalic anhydride, phthalic anhydride, 4-methylphthalic anhydride, 3,6-dichlorophthalic anhydride, 3-hydrophthalic anhydride, 1,2,4-benzenetricarboxylic anhydride, 4-nitrophthalic anhydride.

In a preferred embodiment, the binder resin has a molecular weight in a range of 5000 to 100000 and an acid value in a range of 10 to 300.

In a preferred embodiment, the entire colored dispersion comprises 0.2 to 9% by weight of the resin binder, 0.2 to 9% by weight of the dispersion, 10 to 30% by weight of the pigment, and further comprises a solvent as a residue.

In a preferred embodiment, the pigment is prepared by mixing carbon black with one or more coloring pigments selected from phthalocyanine green, phthalocyanine blue, perylene black, cyanine black, linol yellow, benzidine yellow, victoria pure blue, a white pigment and a fluorescent pigment In a preferred embodiment, at least one first monomer having the structure of Formula 1 is selected from the group consisting of unsaturated carboxylic acid esters, such as benzyl(meth)acrylate, methyl(meth)acrylate, ethyl(meth)acrylate, butyl(meth)acrylate, dimethylaminoethyl(meth)acrylate, isobutyl(meth)acrylate, t-butyl(meth)acrylate, cyclohexyl(meth)acrylate, isobornyl(meth)acrylate, ethylhexyl(meth)acrylate, 2-phenoxyethyl(meth)acrylate, tetrahydrofurfuryl(meth)acrylate, 2-methoxyethyl(meth)acrylate, 3-methoxybutyl(meth)acrylate, ethoxydiethyleneglycol(meth)acrylate, methoxytriethyleneglycol(meth)acrylate, methoxytripropyleneglycol(meth)acrylate, poly(ethyleneglycol)methylether(meth)acrylate, phenoxydiethyleneglycol(meth)acrylate,p-nonylphenoxypolyethylenegylcol(meth)acrylate, p-nonylphenoxypolypropyleneglycol(meth)acrylate, glycidyl(meth)acrylate, tetrafluoropropyl(meth)acrylate, 1,1,1,3,3,3-hexafluoroisopropyl(meth)acrylate, octafluoropentyl(meth)acrylate, heptadecafluorodecyl(meth)acrylate, tribromophenyl(meth)acrylate, dicyclopentanylmethacrylate, dicyclopentenylmethacrylate, dicyclopentenyloxyethylacrylate, isobornyl(meth)acrylate, adamantylmethacrylate, methyl α-hydroxymethyl acrylate, ethyl α-hydroxymethyl acrylate, propyl α-hydroxymethyl acrylate, butyl α-hydroxymethyl acrylate; aromatic vinyls such as styrene, α-methylstyrene, (o,m,p)-vinyl toluene, (o,m,p)-methoxy styrene, (o,m,p)-choloro styrene; unsaturated ethers, such as vinyl methyl ether, vinyl ethyl ether, aryl glycidyl ether; unsaturated imides, such as N-phenyl maleimide, N-(4-chlorophenyl) maleimide, N-(4-hydroxyphenyl) maleimide, N-cyclohexyl maleimide; and maleic anhydrides, such as maleic anhydride, methyl maleic anhydride.

In a preferred embodiment, at least one second monomer having the structure of Formula 2 is selected from the group consisting of hydroxyethyl(meth)acrylate, 2-hydroxypropyl(meth)acrylate, 2-hydroxy-3-chloropropyl(meth)acrylate, 4-hydroxybutyl(meth)acrylate, acyloctyloxy-2-hydroxypropyl(meth)acrylate, polyethyleneglycolmonomethacrylate.

In accordance with another aspect of the present invention, there is provided a photoresist composition, comprising: a colored dispersion, which comprises a binder resin including monomers represented by the Formulas 1 to 4, and a dispersing agent and a pigment; an alkali-soluble resin binder; a multifunctional monomer having an etylenically unsaturated double bond;
a photopolymerization initiator; and a solvent.

In a preferred embodiment, the entire photoresist composition comprises 20 to 60% by weight of the colored dispersion, 1 to 20% by weight of the alkali-soluble resin binder, 1 to 20% by weight of the multifunctional monomer, 0.1 to 20% by weight of the photopolymerization initiator and 30 to 77.9% by weight of the solvent.

In a preferred embodiment, at least one the alkali-soluble resin binder is selected from: unsaturated carboxylic acid esters, such as benzyl(meth)acrylate, methyl(meth)acrylate, ethyl (meth)acrylate, butyl(meth)acrylate, dimethylaminoethyl(meth)acrylate, isobutyl(meth)acrylate, t-butyl(meth)acrylate, cyclohexyl(meth)acrylate, isobornyl(meth)acrylate, ethylhexyl(meth)acrylate, 2-phenoxyethyl(meth)acrylate, tetrahydrofurfuryl(meth)acrylate, hydroxyethyl(meth)acrylate, 2-hydroxypropyl(meth)acrylate, 2-hydroxy-3-chloropropyl(meth)acrylate, 4-hydroxybutyl(meth)acrylate, acyloctyloxy-2-hydroxypropyl(meth)acrylate, glycerol(meth)acrylate, 2-methoxyethyl(meth)acrylate 3-methoxybutyl (meth)acrylate, ethoxydiethyleneglycol(meth)acrylate, methoxytriethyleneglycol(meth)acrylate, methoxytripropyleneglycol(meth)acrylate, poly(ethyleneglycol)methylether (meth)acrylate, phenoxydiethyleneglycol(meth)acrylate, p-nonylphenoxypolyethyleneglycol(meth)acrylate, p-nonylphenoxypolypropyleneglycol(meth)acrylate, glycidyl (meth)acrylate, tetrafluoropropyl(meth)acrylate, 1,1,1,3,3,3-hexafluoroisopropyl(meth)acrylate, octafluoropentyl(meth)acrylate, heptadecafluorodecyl(meth)acrylate, tribromophenyl(meth)acrylate, dicyclopentanylmethacrylate, dicyclopentenylmethacrylate, dicyclopentenyloxyethylacrylate, isobornyl(meth)acrylate, adamantylmethacrylate, methyl α-hydroxymethyl acrylate, ethyl α-hydroxymethyl acrylate, propyl α-hydroxymethyl acrylate, buthyl αa-hydroxymethyl acrylate; aromatic vinyls such as styrene, α-methylstyrene, (o,m,p)-vinyl toluene, (o,m,p)-methoxy styrene, (o,m,p)-choloro styrene; unsaturated ethers, such as vinyl methyl ether, vinyl ethyl ether, aryl gylicidyl ether; unsaturated imides, such as N-phenyl maleimide, N-(4-chlorophenyl) maleimide, N-(4-hydroxyphenyl) maleimide, N-cyclohexyl maleimide; maleic anhydrides, such as maleic anhydride, methyl maleic anhydride; (meth)acrylate, crotonic acid, itaconic acid, maleic acid, fumaric acid, monomethyl maleic acid, 5-norbornene-2-carboxylic acid, mono-2-((meth)acryloyloxy)ethyl phthalate, mono-2-((meth) acryloyloxy)ethyl succinate, and ω-carboxy polycaprolactone mono(meth)acrylate; and
a binder represented by the following formula.

Formula 5

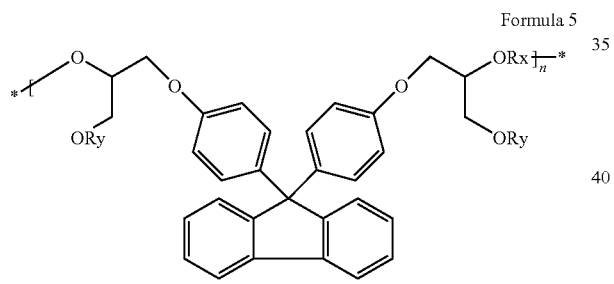

wherein $R_x$ represents a five-membered cyclic carboxylic anhydride or has a structure, which forms combinations by the additional reaction of diisocyanate, Ry is selected from the group consisting of hydrogen, acryloyl, and methacrylol.

In a preferred embodiment, at least one the multifunctional monomer is selected from: a compound that has at least one unsaturated radical, which is capable of being additionally polymerized with a boiling point of 100° C. or more; a functional monomer into which caprolactone is introduced; epoxyacrylate of bisphenol A derivatives; novolac-epoxyacrylate; and urethane-based multifunctional acrylate.

In a preferred embodiment, the photopolymerization initiator is one or more compounds selected from the group consisting of acetophenone compounds, biimidazole compounds, triazine compounds and oxime compounds.

In a preferred embodiment, at least one the solvent is selected from a photo crosslinking accelerator and a hardener.

In a preferred embodiment, at least one additive is selected from the group consisting of a dispersing agent, an adhesion promoter, an antioxidant, an ultraviolet absorber, a thermal polymerization preventing agent, a leveling agent, a carbon black dispersion, and a resin binder having functionality, a monomer, a radiation-sensitive compound.

In accordance with another aspect of the present invention, there is provided a black matrix prepared by the photoresist composition.

Advantageous Effects

The colored dispersion according to the present invention is advantageous in that dispersion stability with other components is maintained while a high light-shielding property is secured, and the photoresist resin composition is advantageous in that improved adhesion to substrates and a wide development process margin are excellent and photosensitivity is increased.

BEST MODE

The colored dispersion according to the present invention comprises a binder resin including monomers represented by formulas 1 to 4, and a dispersing agent and a pigment.

Formula 1

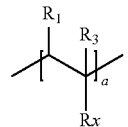

Formula 2

Formula 3

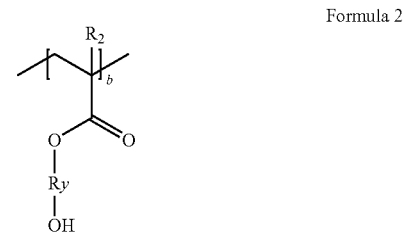

Formula 4

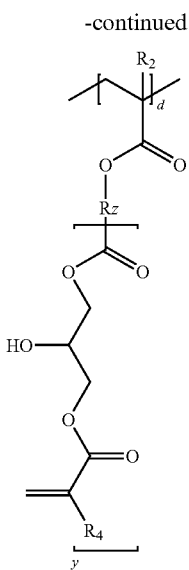

In aforesaid formulas 1 to 4, $R_1$ represents hydrogen, or a radical of forming an imide structure or a five-membered cyclic carboxylic anhydride with $R_x$, $R_2$ and $R_3$ are selected from the group consisting of hydrogen, methyl, and hydroxy methyl, $R_4$ represents hydrogen or a methyl group, $R_x$ is selected from the group consisting of $C_1$ to $C_{12}$ alkyl esters, $C_2$ to $C_6$ alkyl esters substituted with 1 or 2 hydroxy groups, $C_2$ to $C_6$ alkyl esters substituted with $C_1$ to $C_3$ alkoxy groups, $C_1$ to $C_6$ alkyl esters substituted with halogen groups, $C_1$ to $C_3$ alkoxy poly(n=2 to 30) alkylenens, $C_2$ to $C_3$ glycol esters, $C_1$ to $C_6$ alkyl esters substituted with phenyl groups, phenyl substituted with $C_1$ to $C_6$ alkyl groups, phenyl substituted with $C_1$ to $C_6$ alkoxy groups, phenyl substituted with halogen groups, $C_1$ to $C_6$ alkoxy methyl groups, glycidoxy methyl group, $C_5$ to $C_{15}$ cyclic alkyl esters, $C_6$ to $C_{12}$ aromatic groups, and a radical that forms an imide structure or a five-membered cyclic carboxylic anhydride together with $R_1$, $R_y$ is selected from the group consisting of $C_1$ to $C_{12}$ alkylenes, $C_1$ to $C_6$ alkylene groups substituted with halogen groups and $C_2$ to $C_{12}$ alkoxy poly alkylene groups, $R_z$ represents a carboxylic anhydride compound, x represents 1 to 4, y represents 1 to 70, a represents 10 to 50, b represents 1 to 60, c represents 5 to 60, and d represents 1 to 70.

$R_z$ may represent one or more compounds that is selected from the group consisting of succinic anhydride, methyl succinic anhydride, 2,2-dimethyl succinic anhydride, isobutenyl succinic anhydride, 1,2-cyclohexane dicarboxylic anhydride, hexahydro-4-methyl phthalic anhydride, itaconic anhydride, tetrahydro phthalic anhydride, 5-norbornene-2,3-dicarboxylic anhydride, methyl-5-norbornene-2,3-dicaroxylic anhydride, 1,2,3,4-cyclobutanetetracarboxylic dianhydride, maleic anhydride, citraconic anhydride, 2,3-dimethylmaleic anhydride, 1-cyclopentene-1,2-dicarboxylic dianhydride, 3,4,5,6-tetrahydrophthalic anhydride, phthalic anhydride, 4-methylphtalic anhydride, 3,6-dichlorophthalic anhydride, 3-hydrophthalic anhydride, 1,2,4-benzentricarboxylic anhydride and 4-nitrophthalic anhydride, which are carboxylic anhydride compounds capable of reacting with hydroxyl groups attached to the lower part of $R_y$.

A first monomer having the structure of aforesaid formula 1 may comprise at least one that is selected from the group consisting of unsaturated carboxylic acid esters, such as benzyl(meth)acrylate, methyl(meth)acrylate, ethyl(meth)acrylate, butyl(meth)acrylate, dimethylaminoethyl(meth)acrylate, isobutyl(meth)acrylate, t-butyl(meth)acrylate, cyclohexyl(meth)acrylate, isobonyl(meth)acrylate, ethylhexyl(meth)acrylate, 2-phenoxyethyl(meth)acrylate, tetrahydrofurfuryl(meth)acrylate, 2-methoxyethyl(meth)acrylate, 3-methoxybutyl(meth)acrylate, ethoxydiethyleneglycol (meth)acrylate, methoxytriethyleneglycol(meth)acrylate, methoxytripropylenegylcol(meth)acrylate, poly(ethylenegylcol)methylether(meth)acrylate, phenoxydiethyleneglycol(meth)acrylate, p-nonylphenoxypolyethylenegylcol (meth)acrylate, p-nonylphnoxypolypropyleneglycol(meth) acrylate, glycidyl(meth)acrylate, tetrafluoropropyl(meth) acrylate, 1,1,1,3,3,3-hexafluoroisopropyl(meth)acrylate, octafluoropentyl(meth)acrylate, heptadecafluorodecyl (meth)acrylate, tribromophenyl(meth)acrylate, dicyclopentanyl methacrylate, dicyclopentenyl methacrylate, dicyclopentenyloxyethylacrylate, isobonylmethacry7late, adamantylmethacrylate, methyl α-hydroxymethylacrylate, ethyl α-hydroxymethylacrylate, propyl α-hydroxymethylacrylate, buthyl α-hydroxymethylacrylate; aromatic vinyls, such as styrene, α-methylstyrene, (o,m,p) -vinyltoluene, (o,m,p)-methoxystyrene and (o,m,p)-cholorostyrene; unsaturated ethers, such as vinyl methyl ether, vinyl ethyl ether and allyl gylicidyl ether; unsaturated imides, such as N-phenylmaleimide, N-(4-chlorophenyl)maleimide, N-(4-hydroxyphenyl)maleimide and N-cyclohexylmaleimide; and maleic anhydrides, such as maleic anhydride and methyl maleic anhydride. However, the present invention is not limited thereto.

The first monomer having the structure of aforesaid formula 1 allows good computability with solvent parts as a hydrophobic part and plays a role to control the technical intensity of a film when applying it to a composition.

In a second monomer having the structure of aforesaid formula 2, $R_y$ is selected from the group consisting $C_1$ to $C_{12}$ alkylene group, $C_1$ to $C_6$ alkylene group substituted with halogen groups and $C_2$ to $C_{12}$ alkoxy poly alkylene group. Examples of monomers having the structure of formula 2 may comprise at least one that is selected from the group consisting of hydroxyethyl(meth)acrylate, 2-hydroxypropyl(meth) acrylate, 2-hydroxy-3-chloropropyl(meth)acrylate, 4-hydroxybutyl(meth)acrylate, acyloyloxy-2-hydroxypropyl (meth)acrylate, and polyetyleneglycolmonomethacrylate.

The second monomer is a part capable of introducing an acid group to act as an anchor at branched chains through a high molecular reaction later by introducing a tailing group. The second monomer allows to be easily contacted with a pigment (e.g. carbon black) by not directly attaching the acid group to the main chain but far separating it toward branches by controlling the length of $R_y$.

A third monomer having the structure of aforesaid formula 3 is obtained through an additional reaction with an acid anhydride in the second monomer. The acid anhydride may comprise at least one that is selected from the group consisting of succinic anhydride, methyl succinic anhydride, 2,2-dimethyl succinic anhydride, isobutenyl succinic anhydride, 1,2-cyclohexane dicarboxylic anhydride, hexahydro-4-methyl phthalic anhydride, itaconic anhydride, tetrahydro phthalic anhydride, 5-norbornene-2,3-dicarboxylic anhydride, methyl-5-norbornene-2,3-dicaroxylic anhydride, 1,2, 3,4-cyclobutanetetracarboxylic dianhydride, maleic anhydride, citraconic anhydride, 2,3-dimethylmaleic anhydride, 1-cyclopentene-1,2-dicarboxylic dianhydride, 3,4,5,6-tetrahydrophthalic anhydride, phthalic anhydride, 4-methylphtalic anhydride, 3,6-dichlorophthalic anhydride, 3-hydrophthalic anhydride, 1,2,4-benzentricarboxylic anhydride, 4-nitrophthalic anhydride. However, the present invention is not limited thereto.

The third monomer is obtained through the additional reaction with an acid anhydride such as a carboxylic anhydride compound from the second monomer and an acid group located at the end offers dispersion stability by acting as an anchor at the time of dispersion.

A fourth monomer having the structure of aforesaid formula 4 is a monomer to provide a crosslink functional group to a binder and is obtained by an additional reaction with glycidyl acrylate or glycidylmethacrylate in the third monomer.

That is, the fourth monomer is obtained by introducing a reactive group from the third monomer, thereby achieving a high sensitivity of the composition.

A molecular weight of the binder resin is in a range of 5000 to 100000, and the acid value thereof is preferably in a range of 10 to 300.

In the binder resin, a colored dispersion is prepared by mixing carbon black as a black pigment with two or more coloring pigments. Examples of available carbon black comprise SEAST 5HIISAF-HS, SEAST KH, SEAST 3HHAF-HS, SEAST NH, SEAST 3M, SEAST 300HAF-LS, SEAST 116HMMAF-HS, SEAST 116MAF, SEAST FMFEF-HS, SEAST SOFEF, SEAST VGPF, SEAST SVHSRF-HS and SEAST SSRF (commercially available from Tokai Carbon Co., Ltd.); DIAGRAM BLACK II, DIAGRAM BLACK N339, DIAGRAM BLACK SH, DIAGRAM BLACK H, DIAGRAM LH, DIAGRAM HA, DIAGRAM SF, DIAGRAM N550M, DIAGRAM M, DIAGRAM E, DIAGRAM G, DIAGRAM R, DIAGRAM N760M, DIAGRAM LR, #2700, #2600, #2400, #2350, #2300, #2200, #1000, #980, #900, MCF88, #52, #50, #47, #45, #45L, #25, #CF9, #95, #3030, #3050, MA7, MA77, MA8, MA11, OIL7B, OIL9B, OIL11B, OIL30B and OIL31B (commercially available from Mitsubishi Chemical Corporation); PRINTEX-U, PRINTEX-V, PRINTEX-140U, PRINTEX-140V, PRINTEX-95, PRINTEX-85, PRINTEX-75, PRINTEX-55, PRINTEX-45, PRINTEX-300, PRINTEX-35, PRINTEX-25, PRINTEX-200, PRINTEX-40, PRINTEX-30, PRINTEX-3, PRINTEX-A, SPECIAL BLACK-550, SPECIAL BLACK-350, SPECIAL BLACK-250, SPECIAL BLACK-100 and LAMP BLACK-101 (commercially available from Degussa Japan Company); RAVEN-1100ULTRA, RAVEN-1080ULTRA, RAVEN-1060ULTRA, RAVEN-1040, RAVEN-1035, RAVEN-1020, RAVEN-1000, RAVEN-890H, RAVEN-890, RAVEN-880ULTRA, RAVEN-860ULTRA, RAVEN-850, RAVEN-820, RAVEN-790ULTRA, RAVEN-780ULTRA, RAVEN-760ULTRA, RAVEN-520, RAVEN-500, RAVEN-460, RAVEN-450, RAVEN-430ULTRA, RAVEN-420, RAVEN-410, RAVEN-2500ULTRA, RAVEN-2000, RAVEN-1500, RAVEN-1255, RAVEN-1250, RAVEN-1200, RAVEN-1190ULTRA and RAVEN-1170 (commercially available from Columbia Carbon Co.).

Examples of a coloring pigment that can be mixed with the carbon black comprise Carmine 6B (CI. 12490), Phthalocyanine Green (CI. 74260), Phthalocyanine Blue (CI. 74160), Mitsubishi Carbon Black MAlOO, Perylene Black (BASF K0084 and K0086), Cyanine Black, Linol Yellow (CI. 21090), Linol Yellow GRO (CI-21090), Benzidine Yellow 4T-564D, Mitsubishi Carbon Black MA-40, Victoria Pure Blue (CI. 42595), CI. PIGMENT RED 97, 122, 149, 168, 177, 180, 192, 215; CI. Pigment Green 7, 36; CI. PIGMENT 15:1, 15:4, 15:6, 22, 60, 64; CI. PIGMENT 83, 139; and CI. PIGMENT VIOLET 23. In additional, a white pigment and a fluorescent pigment may be used.

In the entire colored dispersion, 0.2 to 9% by weight of the resin binder, 0.2 to 9% by weight of the dispersing agent, 10 to 30% by weight of the pigment, and a solvent as a residue, are included.

When the binder resin is less than 0.2% by weight, the dispersion stability is bad, and when it is more than 9% by weight, a viscosity of the dispersion is high, thereby raising a limitation to a dispersing process. Furthermore, when the dispersing agent is less than 0.2% by weight, it is difficult to uniformly disperse a coloring pigment, thereby it become difficult to prepare a stable dispersion. When the dispersing agent is more than 9% by weight, the dispersion is obtained, but residual dispersing agents contained in the dispersion remaining after dispersing cause a problem that deteriorates the characteristic of a coating paint film to be finally obtained. In the case where the pigment is less than 10% by weight, the amount of the colored dispersion used for manufacturing PR is excessively increased, thereby raising a problem such as a control of viscosity when manufacturing PR, and in the case where it is more than 30% by weight, viscosity is increased at the time of dispersion, and thus, it become difficult to prepare a stable colored dispersion.

The photoresist composition comprising the colored dispersion according to the present invention provides a pattern with a high light-shielding property and a stable process characteristic by securing dispersion stability.

The photoresist composition comprises a colored dispersion including a binder resin containing monomers represented by Formulas 1 to 4, an alkali-soluble resin binder, a multifunctional monomer having an ethylenically unsaturated double bond, a photopolymerization initiator and a solvent.

The alkali-soluble resin binder consists of a monomer to provide technical intensity and a monomer to provide an alkali solubility. The examples thereof are as follows.

The monomer to provide technical intensity to a film may use at least one, preferably two or more, selected from the group consisting of unsaturated carboxylic acid esters, such as benzyl(meth)acrylate, methyl(meth)acrylate, ethyl(meth)acrylate, buthyl(meth)acrylate, dimethylaminoethyl(meth)acrylate, isobutyl(meth)acrylate, t-buthyl(meth)acrylate, cyclohexyl(meth)acrylate, isobonyl(meth)acrylate, ethylhexyl(meth)acrylate, 2-phenoxyethyl(meth)acrylate, tetrahydrofurfuryl(meth)acrylate, hydroxyethyl(meth)acrylate, 2-hydroxypropyl(meth)acrylate, 2-hydroxy-3-chloropropyl(meth)acrylate, 4-hydroxybutyl(meth)acrylate, acyloctyloxy-2-hydroxypropyl(meth)acrylate, glycerol(meth)acrylate, 2-methoxyethyl(meth)acrylate, 3-methoxybuthyl(meth)acrylate, ethoxydiethyleneglycol(meth)acrylate, methoxytriethyleneglycol(meth)acrylate, methoxytripropyleneglycol(meth)acrylate, poly(ethylenegylcol)methylether (meth)acrylate, phenoxydiethyleneglycol(meth)acrylate, p-nonylphenoxypolyethylenegylcol(meth)acrylate, p-nonylphnoxypolypropyleneglycol(meth)acrylate, glycidyl (meth)acrylate, tetrafluoropropyl(meth)acrylate, 1,1,1,3,3,3-hexafluoroisopropyl(meth)acrylate, octafluoropentyl(meth)acrylate, heptadecafluorodecyl(meth)acrylate, tribromophenyl(meth)acrylate, dicyclopentanylmethacrylate, dicyclopentenylmethacrylate, dicyclopentenyloxyethylacrylate, isobonylmethacrylate, adamantylmethacrylate, methyl α-hydroxymethyl acrylate, ethyl α-hydroxymethyl acrylate, propyl α-hydroxymethyl acrylate, buthyl α-hydroxymethyl acrylate; aromatic vinyls such as styrene, α-methylstyrene, (o,m,p)-vinyl toluene, (o,m,p)-methoxy styrene, (o,m,p)-choloro styrene; unsaturated ethers, such as vinyl methyl ether, vinyl ethyl ether, aryl gylicidil ether; unsaturated imides, such as N-phenyl maleimide, N-(4-chlorophenyl) maleimide, N-(4-hydroxyphenyl) maleimide, N-cyclohexyl maleimide; maleric anhirdes, such as maleic anhydride, methyl maleic anhydride. However, the present invention is not limited thereto.

Further, the monomer to provide an alkali solubility may preferably use at least one selected from the group consisting of (meth)acrylate, crotonic acid, itaconic acid, maleic acid, fumaric acid, monomethyl maleic acid, 5-norbornene-2-carboxylic acid, mono-2-((meth)acryloyloxy)ethyl phthalate, mono-2-((meth)acryloyloxy)ethyl succinate, and ω-carboxy polycaprolactone mono(meth)acrylate. However, the present invention is not limited thereto. Also, the binder represented by the following formula 5 may be used.

Formula 5

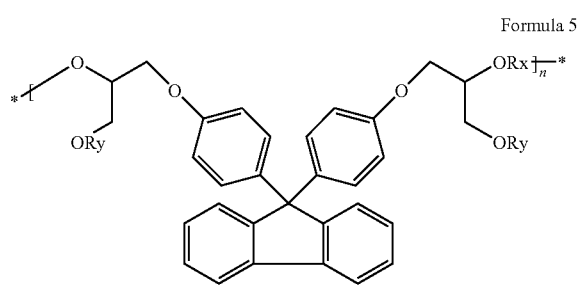

wherein $R_x$ represents a five-membered cyclic carboxylic anhydride or has a structure in which a combination is formed by an additional reaction of diisocyanate, and the examples thereof may be selected from the group consisting of succinic anhydride, methyl succinic anhydride, 2,2-dimethyl succinic anhydride, isobutenyl succinic anhydride, 1,2-cyclohexane dicarboxylic anhydride, hexahydro-4-methyl phthalic anhydride, itaconic anhydride, tetrahydro phthalic anhydride, 5-norbornene-2,3-dicarboxylic anhydride, methyl-5-norbornene-2,3-dicaroxylic anhydride, 1,2,3,4-cyclobutanetetracarboxylic dianhydride, maleic anhydride, citraconic anhydride, 2,3-dimethylmaleic anhydride, 1-cyclopentene -1,2-dicarboxylic dianhydride, 3,4,5,6-tetrahydrophthalic anhydride, phthalic anhydride, bisphthalic anhydride, 4-methylphtalic anhydride, 3,6-dichlorophthalic anhydride, 3-hydrophthalic anhydride, 1,2,4-benzentricarboxylic anhydride, 4-nitrophthalic anhydride and diethylglycol-1,2-bistrimaleic anhydride. However, the present invention is not limited thereto. $R_y$ is selected from the group consisting of hydrogen, acryloyl and metha acryloyl. A weight average molecular weight is preferably in a range of 1,000 to 200,000, and more preferably in a range of 5,000 to 100,000.

The multifunctional monomer may use a compound that has at least one unsaturated radical, which is capable of being additionally polymerized with a boiling point of 100° C. or more, or a functional monomer into which caprolactone is introduced.

The compound that has at least one unsaturated radical, which is capable of being additionally polymerized with a boiling point of 100° C. or more may be a mono-functional monomer, such as polyethylene glycolmono(meth)acrylate, polypropylene glycol mono(meth)acrylate, or phenoxyethyl (meth)acrylate; and a multifunctional monomer, such as polyethylene glycol(meth)acrylate, polypropylene glycol (meth)acryatle, trimethylol ethane triacrylate, trimethylol propane triacrylate, neopentyl glycol (meth)acrylate, pentaerythritol tetraacrylate, pentaerythritol triacrylate, dipentaerythritol pentaacrylate, or dipentaerythritol hexaacrylate.

Furthermore, the multifunctional monomer into which the caprolactone is introduced may be KAYARAD DPCA-20, 30, 60, 120 introduced into dipentaerythritol, KAYARAD TC-110S introduced into tetrahydrofuryl acrylate, or KAYARAD HX-220 and KAYARAD HK-620 introduced into neopentylglycol hydroxypivalate. In additional to the above-described examples, the multifunctional monomer may be epoxyacrylate of bisphenol A derivatives, novolacepoxyacrylate, and U-324A, U15HA, and U-4HA as urethane-based multifunctional acrylate.

The multifunctional monomer that has an ethylenically unsaturated double bond may be one monomer or a mixture of at least one two kinds of monomers.

Preferably, the multifunctional monomer that has the ethylenically unsaturated double bond is contained in a range of 1 to 20 parts by weight (5 to 50 parts by weight on the basis of a solid of a resin composition) based on the total weight of the photoresist composition. When the content of the multifunctional monomer is less than 1 part by weight, photosensitivity or strength of a coating film is lowered. When the content thereof exceeds 20 parts by weight, adhesiveness of the photosensitive resin layer is excessively strong, which causes problems in that strength of the coating film is insufficient and a pattern is lost at the time of development. The photopolymerization initiator, used in the present invention, is a material that generates a radical by light and initiates crosslinking, and is preferably obtained by mixing compounds of one or more kinds selected from the group consisting of acetophenone compounds, biimidazole compounds, triazine compounds, and oxime compounds.

Examples of the acetophenone compounds that can be used as the photopolymerization initiator include 2-hydroxy-2-methyl-1-phenylpropan-1-on, 1-(4-isopropylphenyl)-2-hydroxy-2-methylpropan-1-on, 4-(2-hydroxyethoxy)-phenyl-(2-hydroxy-2-propyl)ketone, 1-hydroxy cyclohexylphenyl ketone, benzoin methyl ether, benzoin ethyl ether, benzoin isobuthyl ether, benzoin butyl ether, 2,2-dimethoxy-2-phenylacetophenone, 2-methyl-(4-methylthio)phenyl-2-morpholino-1-propan-1-on, 2-benzyl-2-dimethylamino-1-(4-morpholinophenyl)-butan-1-on, 2-(4-bromo-benzyl-2-dimethylamino-1-(4-morpholinophenyl)-butan-1-on, and 2-methyl-1-[4-(methylthio)phenyl]-2-morpholinopropane-1-on. Examples of the biimidazole compounds include 2,2-bis(2-chlorophenyl)-4,4',5,5'-tetraphenyl biimidazole, 2,2'-bis(o-chlorophenyl)-4,4',5,5'-tetrakis(3,4,5-trimethoxyphenyl)-1,2'-biimidazole, 2,2'-bis(2,3-dichlorophenyl)-4,4,'5,5'-tetraphenyl biimidazole, and 2,2'-bis(o-chlorophenyl)-4,4',5,5'-tetraphenyl-1,2'-biimidazole. Examples of the triazine compounds include 3-{4-[2,4-bis (trichloromethyl)-s-triazin-6-yl]phenylthio} propionic acid, 1,1,1,3,3,3-hexafluoroisopropyl-3-{4-[2,4-bis(trichloromethyl)-s-triazin-6-yl]phenylthio}propionate, ethyl-2-{4-[2,4-bis(trichloromethyl)-s-triazin-6-yl]phenylthio}acetate, 2-epoxyethyl-2-{4-[2,4-bis (trichloromethyl)-s-triazin-6-yl] phenylthio} acetate, cyclohexyl-2-{-[2,4-bis(trichloromethyl)-s-triazin-6-yl]phenylthio}acetate, benzyl-2-{-[2,4-bis (trichloromethyl)-s-triazin-6-yl]phenylthio}acetate, 3-{chloro-4-[2,4-bis(trichloromethyl)-s-triazin-6-yl] phenylthio}propionic acid, 3-{4-[2,4-bis(trichloromethyl-s-triazin-6-yl]phenylthio}propionamide, 2,4-bis(trichloromethyl)-6-p-methoxystyryl-s-triazin, 2,4-bis (trichloromethyl)-6-(1-p-dimethylaminophenyl)-1,3-butadienyl-s-triazin, and 2-trichloromethyl-4-amino-6-p-methoxystyryl-s-triazin. Examples of the oxime compounds include 1,2-octadione-1-(4-phenylthio)phenyl-2-(o-benzoyloxime) (CGI-124 manufactured by Ciba-Geigy Corp.), and 1-(O-acetyloxime)-1-[9-ethyl-6-(2-methylbenzoyl)-carbazol-3-yl]ethanone(CGI242).

The photopolymerization initiator is preferably used in a range of 1 to 300 parts by weight based on 100 parts by weight that corresponds to a sum between the multifunctional monomer having an ethylenically unsaturated double bond and the unsaturated double bond included in a binder in a photoresist composition. In particular, the photopolymerization initiator preferably uses 1 to 30 parts by weight of an acetophenone compound, 1 to 30 parts by weight of a biimidazole compound, 1 to 30 parts by weight of a triazin compound, and 1 to 30 parts by weight of an oxime compound.

The photopolymerization initiator may further contain 0.01 to 10 parts by weight of a photo crosslinking accelerator that accelerates generation of a radical as an auxiliary component, or 0.01 to 10 parts by weight of a hardener that accelerates hardening.

The photo crosslinking accelerator includes benzophenone compounds, such as benzophenone, 4,4-bis(dimethylamino) benzophenone, 4,4-bis(diethylamino)benzophenone, 2,4,6-trimethylaminobenzophenone, methyl-o-benzoylbenzoate, 3,3-dimethyl-4-methoxybenzophenone, and 3,3,4,4-tetra(t-butylperoxycarbonyl)benzophenone; fluorenone compounds, such as 9-fluorenone, 2-chloro-9-fluorenone, and 2-methyl-9-fluorenone; thioxanthone compounds, such as thioxanthone, 2,4-diethyl thioxanthone, 2-chloro thioxanthone, 1-chloro-4-propyloxy thioxanthone, isopropylthioxanthone, and diisopropylthioxanthone; xanthone compounds, such as xanthone and 2-methylxanthone; an anthraquinone compounds, such as anthraquinone, 2-methyl anthraquinone, 2-ethyl anthraquinone, t-butyl anthraquinone, and 2,6-dichloro-9,10-anthraquinone; acridine compounds, such as 9-phenylacridine, 1,7-bis(9-acridinyl)heptane, 1,5-bis(9-acridinylpentane), and 1,3-bis(9-acridinyl)propane; dicarbonyl compounds, such as benzyl, 1,7,7-trimethyl-bicyclo[2,2,1]heptane-2,3-dione, and 9,10-phenanthrenequinone; phosphine oxide compounds, such as 2,4,6-trimethybenzoyl diphenyl phosphine oxide, and bis(2,6-dimethoxybenzoyl)-2,4,4-trimethylpentyl phosphine oxide; benzophenone compounds, such as methyl-4-(dimethylamino)-benzoate, ethyl-4-(dimethylamino)-benzoate, and 2-n-butoxyethyl-4(dimethylamino)-benzoate; amino synergists, such as 2,5-bis(4-diethylaminobenzal)cyclopentanone, 2,6-bis(4-diethylaminobenzal)cyclohexanon, and 2,6-bis(4-diethylaminobenzal)-4-methyl-cyclopentanone; coumarin compounds, such as 3,3-carbonylvinyl-7-(diethylamino)coumarin, 3-(2-benzothiazolyl)-7-(diethylamino)coumarin, 3-benzoyl-7-(diethylamino)coumarin, 3-benzoyl-7-methoxy-coumarin, and 10,10-carbonylbis[1,1,7,7-tetramethyl-2,3,6,7-tetrahydro-1H,5H, 1 1H-Cl]-benzopyrano[6,7,8-ij]-quinolizin-11-on; chalcone compounds, such as 4-diethylamino chalcone, and 4-azidebenzalacetophenone; and 2-benzoylmethylene, or 3-methyl-b-naphthothiazoline. Further, the hardener may be 2-mercaptobenzoimidazole, 2-mercaptobenzothiazole, 2-mercaptobenzoxazole, 2,5-dimercapto-1,3,4-thiadiazole, 2-mercapto-4,6-dimethylaminopyridine, pentaerythritol-tetrakis(3-mercaptopropionate), pentaerythritol -tris(3-mercaptopropionate), pentaerythritol-tetrakis(2-mercaptoacetate), pentaerythritol-tris(2-mercaptoacetate), trimethylolpropane-tris(2-mercaptoacetate), or trimethylolpropanetris (3-mercaptopropionate).

In consideration of solubility, pigment dispersability, and coating, the solvent, used in the present invention, may be propylene glycol monomethyl ether, ethylene glycol monomethyl ether acetate, propylene glycol monomethyl ether acetate, propylene glycol monoethyl ether acetate, diethylene glycol dimethyl ether, cyclohexanon, 2-heptanon, 3-heptanon, 2-hydroxyethylpropionate, 3-methyl-3-methoxybutylpropionate, ethyl-3-methoxypropionate, methyl-3-ethoxypropionate, ethyl-3-ethoxypropionate, butylacetate, amylpermate, isoamylacetate, isobutylacetate, butylpropionate, isopropylbutyrate, ethylbutyrate, butylbutyrate, ethylpyruvate, or γ-butyrolacetate. The solvent may be independently used or the resultant obtained by mixing two or more kinds of solvents may be used as the solvent. Furthermore, in the entire photoresist composition, preferably, 20 to 60% by weight of the color dispersion, 1 to 20% by weight of the alkali soluble resin binder, 1 to 20% by weight of the multifunctional monomer, 0.1 to 20% by weight of the photopolymerization initiator, and 30 to 77.9% by weight of the solvent are included.

The photoresist composition according to the present invention may additionally use a additive, which is at least one selected from the group consisting of a dispersing agent, an adhesion promoter, an antioxidant, an ultraviolet absorber, a thermal polymerization preventing agent and a leveling agent.

The adhesion promoter may include vinyltrimethoxysilane, vinyltriethoxysilane, vinyl tris(2-methoxyethoxy)-silane, N-(2-aminoethyl)-3-aminopropylmethyldimethoxy silane, N-(2-aminoethyl)-3-aminopropylmethyltrimethoxysilane, 3-aminopropyltriethoxysilane, 3-glycidoxypropyltriethoxysilane, 3-glycidoxypropylmethyldimethoxysilane, 2-(3,4-ethoxycyclohexyl)ethyltrimethoxysilane, 3-chloropropylmethyldimethoxysilane, 3-chloropropyltrimethoxysilane, 3-methacryloxypropyltrimethoxysilane, or 3-mercaptopropyltrimethoxysilane.

As the antioxidant, 2,2-thiobis(4-methyl-6-t-butylphenol), or 2,6-di-t-butylphenol may be used, and as the ultraviolet absorber, 2-(3-t-butyl-5-methyl-2-hydroxyphenyl)-5-chlorobenzotriazol, or alkoxy benzophenone may be used. Further, the thermal polymerization preventing agent may be hydroquinone, p-methoxyphenol, di-t-butyl-p-cresol, pyrogallol, t-butylcatechol, benzoquinone, 4,4-thiobis(3-methyl-6-t-butylphenol), 2,2-methylene bis(4-methyl-6-t-butylphenol), or 2-mercaptoimidazole.

The photoresist composition may further include an additive that is at least one selected from the group consisting of a carbon black dispersion, a resin binder having functionality, a monomer, a radiation-sensitive compound, and other additives.

The present invention provides a black matrix for a liquid crystal display comprising a black matrix photoresist resin for the liquid crystal display.

When the colored dispersion according to the present invention is used, it was found that the binder structure to be added at the time of milling importantly acts. At the time of milling, the alkali-soluble carboxylic acid can easily act as an achor by introducing branched chains through a molecula reaction, and thus, placing it far away from a main chain rather than applying it to the main chain. As a result, the composition appeared to have a stable dispersion property and it became possible to provide the resist having a uniform process property.

With respect to a black matrix photoresist composition for a liquid crystal display, the present invention provides a black matrix photoresist composition comprising a coloring agent including a black pigment, an alkali-soluble resin binder, a multifunctional monomer having an ethylenically unsaturated double bond, a photopolymerization initiator and solvent, further provides a black matrix for a liquid crystal, which is manufactured by a manufacturing method comprising: applying the black matrix photoresist composition for the liquid crystal display to a panel; and exposing and developing the applied black matrix photoresist composition.

Furthermore, as described above, the present invention provides the black matrix for the liquid crystal display that is manufactured according to the manufacturing method comprising the steps of applying the black matrix photoresist composition to a panel and exposing and developing the applied black matrix photoresist composition, and thus, the black matrix according to the present invention is advantageous in that a developing property, a light shielding property, and an insulating property are excellent, a residue does not exist, and defective display can be prevented from occurring due to heat treatment.

MODE FOR INVENTION

Hereinafter, for the purpose of better understanding for the present invention, the preferred embodiments of the present invention are disclosed. However, the embodiments are illustrative, and the present invention should not be construed as being limited to the embodiments set forth herein.

EXAMPLE

Example 1

(The Preparation of Colored Dispersion 1)

Colored dispersion 1 (a carbon content of 20%) is obtained by dispersing for five hours 1000 g of carbon black (special black 550), 500 g of a dispersion (disperbyk 168, 30%), 500 g of a binder (benzylmethacrylate/styrene/hydroxyethylmethacrylate/succininc anhydride adding hydroxyethylmethacrylate/glycidylmethacrylate adding succinic anhydride adding hydroxyethylmethacrylate (molar ratio: 20/20/10/30/20, acid value: 78, Mw=18,000 and solid: 30%), 3000 g of propyleneglycolmonomethyletheracrylate and a zirconia beads, using a dispersing equipment.

(The Preparation of Photoresist Composition 1)

900 g of the obtained colored dispersion 1, 50 g of a alkali-soluable resin binder (benzyl(meth)acrylate/styrene/N-phenylmaleimide/(meth)acrylic acid/glycidylmethacrylate adding methacrylic acid (molar ratio: 42/8/6/24/20, Mw=15,000, acid value: 84 KOH mg/g), 50 g of dipentaerythritolhexaacrylate as a functional monomer, 20 g of 1-(O-acetyloxime)-1-[9-ethyl-6-(2-methylbenzoyl)-carbazol-3-yl]ethanone as a photopolymerization initiator, 10 g of 2-benzyl-2-dimethylamino-1-(4-morpholinophenyl)-butan-1-on, 5 g of 3-methacryloxypropyltrimethoxysilane as an adhesion promoter, 1 g of a leveling agent as an adhesion promoter, and 510 g of propylene glycol monomethyl ether acetate and 510 g of 3-methoxybutyl acetate as solvents, are mixed. Then, the obtained mixture is stirred for 5 hours, thereby preparing the black matrix photoresist composition 1.

The photoresist composition solution prepared by the above-described method is spin-coated onto glass and prebaked at the temperature of about 10° C. for 2 minutes, thereby forming a coating film having the thickness of approximately 1.22 μM. Then, the substrate is cooled down at the room temperature, and exposed with energy of 60 mJ/cm$^2$ using a photomask under a high pressure mercury lamp. After the exposed substrate is developed using a spray method in an aqueous KOH solution of 0.04% at the temperature of 25° C., the substrate is washed with pure water, dried, and post-baked at the temperature of 230° C. for 20 minutes in a convection oven.

Example 2

(The Preparation of Colored Dispersion 2)

Colored dispersion 2 (a carbon content of 20%) is obtained by dispersing for five hours 1000 g of carbon black (special black 550), 500 g of a dispersion (disperbyk 168, 30%), 500 g of a binder (benzylmethacrylate/styrene/hydroxyethylmethacrylate/tetrahydrophthalic anhydride adding hydroxyethylmethacrylate/glycidylmethacrylate adding tetrahydrophthalic anhydride adding hydroxyethylmethacrylate (molar ratio: 20/20/5/35/20, acid value: 79, Mw=20,000, solid: 30%), 3000 g of propyleneglycolmonomethyletheracrylate and a zirconia beads, using a dispersing equipment.

(The Preparation of Photoresist Composition 2)

Photoresist composition 2 is prepared by the same method as that in example 1, except for using colored dispersion 2.

Example 3

(The Preparation of Colored Dispersion 3)

Colored dispersion 3 (a carbon content of 20%) is obtained by dispersing for five hours 1000 g of carbon black (special black 550), 500 g of a dispersion (disperbyk 168, 30%), 500 g of a binder (dicyclopentanylmethacrylate/benzylmethacrylate/hydroxyethylmethacrylate/1,2,4-benzentricarboxylic anhydride adding hydroxyethylmethacrylate/glycidylmethacrylate adding 1,2,4-benzentricarboxylic anhydride adding hydroxyethylmethacrylate (molar ratio: 30/20/10/20/20, acid value: 82, Mw=20,000, solid: 30%), 3000 g of propyleneglycolmonomethyletheracrylate and a zirconia beads, using a dispersing equipment.

(The Preparation of Photoresist Composition 3)

Photoresist composition 3 is prepared by the same method as that in example 1, except for using colored dispersion 3.

Example 4

(The Preparation of Colored Dispersion 4)

Colored dispersion 4 (a carbon content of 20%) is obtained by dispersing for five hours 1000 g of carbon black (special black 550), 500 g of a dispersion (disperbyk 168, 30%), 500 g of a binder (dicyclopentanylmethacrylate/styrene/hydroxyethylmethacrylate/1,2,4-benzentricarboxylic anhydride adding hydroxyethylmethacrylate/glycidylmethacrylate adding 1,2,4-benzentricarboxylic anhydride adding hydroxyethylmethacrylate (molar ratio: 40/20/10/15/15, acid value: 70, Mw=16,000, solid: 30%), 3000 g of propyleneglycolmonomethyletheracrylate and a zirconia beads, using a dispersing equipment.

(The Preparation of Photoresist Composition 4)

Photoresist composition 4 is prepared by the same method as that in example 1 except for using colored dispersion 4.

Example 5

(The Preparation of Colored Dispersion 5)

Colored dispersion 5 (carbon content: 20%) is obtained by dispersing for five hours 1000 g of carbon black (special black 550), 500 g of a dispersion (disperbyk 168, 30%), 500 g of a binder (dicyclopentanylmethacrylate/benzylmethacrylate/hydroxybutylmethacrylate/1,2,4-benzentricarboxylic anhydride adding hydroxybutylmethacrylate/glycidylmethacrylate adding 1,2,4-benzentricarboxylic anhydride adding hydroxybutylmethacrylate (molar ratio: 30/20/10/20/20, acid value: 80, Mw=20,000, solid: 30%), 3000 g of propyleneglycolmonomethyletheracrylate and a zirconia beads, using a dispersing equipment.

(The Preparation of Photoresist Composition 5)

Photoresist composition 5 is prepared by the same method as that in example 1 except for using colored dispersion 5.

Example 6

(The Preparation of Colored Dispersion 6)

Colored dispersion 6 (carbon content: 20%) is obtained by dispersing for five hours 1000 g of carbon black (special black 550), 500 g of a dispersion (disperbyk 168, 30%), 500 g of a binder (dicyclopentanylmethacrylate/styrene/hydroxybutylmethacrylate/1,2,4-benzentricarboxylic anhydride adding hydroxybutylmethacrylate/glycidylmethacrylate adding 1,2,4-benzentricarboxylic anhydride adding hydroxybutylmethacrylate(molar ratio: 40/20/10/15/15, acid value: 68, Mw=15,000, Solid: 30%), 3000 g of propylenegylcolmonomethyletheracrylate and a zirconia beads, using a dispersing equipment.

(The Production of Photoresist Composition 6)

Photoresist composition 6 is prepared by the same method as that in example 1 except for using colored dispersion 6.

Example 7

(The Preparation of Photoresist Composition 7)

Photoresist composition 7 is produced by the same method as that in Example 1, except for the fact that 20 g of benzylmethacrylate/strene/hydroxyethylmethacrylate/succinic anhydride adding hydroxyethylmethacrylate/glycidylmethacrylate adding succinic anhydride adding hydroxyethylmethacrylate (molar ratio: 20/20/10/15/15, acid value: 78, Mw=18,000) and 30 g benzyl(meth)acrylate/styrene/N-phenylmaleimide/(meth)acrylic acid/glycidylmethacrylate adding methacrylic acid (mole ratio 42/8/6/24/20, Mw=15,000, Acid value: 84 KOH mg/g) are used as alkali-soluble resin binders.

In the coating film pattern obtained by Examples 1 to 7, the thickness of the coating film is 1.1 µm, and thus omission of the pattern does not exist at all, and straightness is excellent and a clear pattern characteristic is obtained without the contamination of an exposure portion. Further, the optical density is 4.5 or more and an excellent light shielding characteristic is obtained.

To check stability of the composition, a change in viscosity and a process characteristic were again checked after putting it in oven at the temperature of 45° C. for a week. When checking a characteristic of the coating film obtained by spin coating, pre-baked, exposure, development, post-baked as the same processes as those at the time of production, the same optical density and developing property as those in a result immediately after producing were obtained, and a clear pattern without residues and projections was obtained.

COMPARATIVE EXAMPLE

Comparative Example 1

(The Preparation of Colored Dispersion 8)

Colored dispersion 8 (carbon content: 20%) is obtained by dispersing for five hours 1000 g of carbon black (special black 550), 500 g of a dispersion (disperbyk 168, 30%), 500 g of a binder (benzylmethacrylate/styrene/methacrylic acid/glycidylmethacrylate adding methacrylic acid (molar ratio: 25/35/20/20, Acid value: 79, Mw=19000, Solid: 30%), 3000 g of propyleneglycolmonomethyletheracrylate and a zirconia beads, using a dispersing equipment.

(The Preparation of Photoresist Composition 8)

Photoresist composition 8 is prepared by the same method as that in example 1 except for using colored dispersion 8.

Comparative Example 2

(The Preparation of Colored Dispersion 9)

Colored dispersion 9 (carbon content: 20%) is obtained by dispersing for five hours 1000 g of carbon black (special black 550), 500 g of a dispersion (disperbyk 168, 30%), 500 g of a binder (dicyclopenthanylmethacrylate/benzylmethacrylate/methacrylic acid/glycidylmethacrylate adding methacrylic acid (molar ratio: 30/25/25/20, acid value: 80, Mw=18,000, solid: 30%), 3000 g of propyleneglycolmonomethyletheracrylate and a zirconia beads, using a dispersing equipment.

(The Production of Photoresist Composition 9)

Photoresist composition 9 is prepared by the same method as that in example 1 except for using colored dispersion 9.

Comparative Example 3

(The Preparation of Photoresist Composition 10)

Photoresist composition 10 is prepared by the same method as that in Example 2 except for the fact that benzylmethacrylate/styrene/hydroxyethylmethacrylate/succinic anhydride adding hydroxyethylmetharcylate/glycidylmethacrylate adding succinic anhydride adding hydroxyethylmetharcylate (mole ratio: 20/20/10/30/20, acid value: 78 and Mw=18,000) are used as an alkali soluble resin binder.

In the coating film pattern obtained by the same process as that in Example 1, immediately after producing it, the thickness of the coating film is 1.1 µm, and thus omission of the pattern does not exsit at all, and straightness is excellent and a clear pattern characteristic is obtained without the contamination of an exposure portion. Further, the opical density is 4.5 or more and an excellent light shielding characteristic is obtained. However, when a change in viscosity and a process characteristic were again checked after putting it in oven at the temperature of 45° C. for a week, viscosity is increased, and in the coating film obtained by spin coating, prebaked, exposure, development and post-baked, as the same processes as those at the time of preparation, the straightness and development margin were deteriorated, and particularly, residues were generated by the deterioration of stability.

Based on the above, in the case of the comparative examples, it was found that development is deteriorated by the increased developing time to 15 seconds or more compared with Examples 1 to 7. Further, in the case of comparative examples on the degree of viscosity after keeping in oven, it became difficult to handle it due to the increase of more than 10% in viscosity and, strength of a film and adhesion to the substrate were deteriorated. In the case of the residues, they are not generated in the examples but are generated in the comparative examples.

Accordingly, in the case where the binder resin according to the present invention is used as the binder resin of the colored dispersion, dispersion stability is improved, and thus the colored dispersion has an excellent property with respect to the viscosity, development, residues thereof even after keeping in oven, which is different from the comparative examples.

Moreover, the resin used as a binder resin for dispersion of the colored dispersion in Example 1 is used as the alkali-soluble resin binder in Comparative example 3, but in consideration of the fact that stability is not obtained in Comparative Example 3 using the different resin from the present invention for dispersion, as the binder resin according to the present invention is used in the colored dispersion, the stability of PR is obtained.

TABLE 1

| Example | Colored dispersion binder | Alkali-soluble resin binder | Characteristic of initial process | Change in viscosity after keeping in oven | Developability after oven | Residue |
|---|---|---|---|---|---|---|
| Example 1 | A | I | ○ | <5% | ○ | None |
| Example 2 | B | I | ○ | <5% | ○ | None |
| Example 3 | C | I | ○ | <5% | ○ | None |
| Example 4 | D | I | ○ | <5% | ○ | None |
| Example 5 | E | I | ○ | <5% | ○ | None |
| Example 6 | F | I | ○ | <5% | ○ | None |
| Example 7 | A | J | ○ | <5% | ○ | None |
| Comparative Example 1 | G | I | ○ | >10% | +15 seconds | residue occurrence |
| Comparative Example 2 | H | I | ○ | >10% | +15 seconds | residue occurrence |
| Comparative Example 3 | H | A | ○ | >10% | +15 seconds | residue occurrence |

A: Benzylmethacrylate/styrene/hydroxyethylmethacrylate/succinic anhydride hydroxyethylmethacrylate/glycidylmethacrylate adding succinic anhydride adding hydroxyethylmethacrylate (mole ratio: 20/20/10/30/20, acid value: 78, Mw = 18,000)

B: Benzylmethacrylate/styrene/hydroxyethylmethacrylate/tetrahydrophthalic anhydride adding hydroxyethylmethacrylate/glycidylmethacrylate adding tetrahydrophtalic anhydride adding hydroxyethylmethacrylate (mole ratio: 20/20/5/35/20, acid value: 79, Mw = 20,000)

C: Dicyclopentanylmethacrylate/benzylmethacrylate/hydroxyethylmethacrylate/1,2,4-bezentricarboxylic anhydride adding hydroxyethylmethacrylate/glycidylmethacrylate adding 1,2,4-bezentricarboxylic anhydride adding hydroxyethylmethacrylate (mole ratio: 30/20/10/20/20, acid value: 82, Mw = 20,000)

D: Dicyclopentanylmethacrylate/styrene/hydroxyethylmethacrylate/1,2,4-benzentricarboxylic anhydride adding hydroxyethylmethacrylate/glycidylmethacrylate adding 1,2,4-bezentricarboxylic anhydride adding hydroxyethylmethacrylate (mole ratio: 40/20/10/15/15, acid value: 70, Mw = 16000)

E: Dicyclopentanylmethacrylate/benzylmethacrylate/hydroxybutylmethacrylate/1,2,4-benzentricarboxylic anhydride adding hydroxybutylmethacrylate/glycidylmethacrylate adding 1,2,4-benzentricarboxylic anhydride adding hydroxybutylmethacrylate (mole ratio: 30/20/10/20/20, acid value: 80 and Mw = 20,000)

F: Dicyclopentanylmethacrylate/styrene/hydroxybutylmethacrylate/1,2,4-benzentricarboxylic anhydride adding hydroxybutylmethacrylate/glycidylmethacrylate adding 1,2,4-benzentricarboxylic anhydride adding hydroxybutylmethacrylate (mole ratio: 40/20/10/15/15, acid value: 68 and Mw = 15,000)

*166G: benzylmethacrylate/styrene/methacrylic acid/glycidylmethacrylate adding methacrylic acid (mole ratio: 25/35/20/20, acid value: 79 and Mw = 19,000)

H: Dicyclopentanylmethacrylate/benzylmethacrylate/methacrylic acid/glycidylmethacrylate adding methacrylic acid (mole ratio: 30/25/25/20, acid value: 80 and Mw = 18,000)

I: Benzyl(meth)acrylate/styrene/N-phenylmaleimide/(meth)acrylic acid/glycidylmethacrylate adding methacrylic acid (mole ratio: 42/8/6/24/20, Mw = 15000 and acid value: 84KOH mg/g)

J: 20 g of benzylmethacrylate/styrene/hydroxyethylmethacrylate/succinic anhydride adding hydroxyethylmethacrylate/glycidylmethacrylate adding succinic anhydride adding hydroxyethylmethacrylate (mole ratio: 20/20/10/30/20, acid value: 78 and Mw = 18,000) 30 g of benzyl(meth)acrylate/styrene/N-phenylmaleimide/(meth)acrylic acid/glycidylmethacrylate adding methacrylic acid (mole ratio: 42/8/6/24/20 and Mw = 15,000, acid value: 84 KOH mg/g)

The invention claimed is:

1. A colored dispersion, comprising:

a binder resin copolymer including 40-60 mol % of monomers represented by the following Formula 1, 5-10 mol % of polyethyleneglycolmonomethacrylate, 15-35 mol % of monomer represented by the following Formula 3, and 15-20 mol % of monomers represented by the following Formula 4, the binder resin copolymer being in the amount of 0.2 to 9% by weight based on the colored dispersion, a dispersing agent in the amount of 0.2 to 9% by weight based on the colored dispersion, a pigment in the amount of 10 to 30% by weight based on the colored dispersion, and a solvent as a residue,

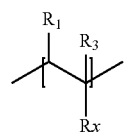

Formula 1

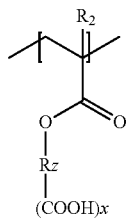

Formula 3

Formula 4

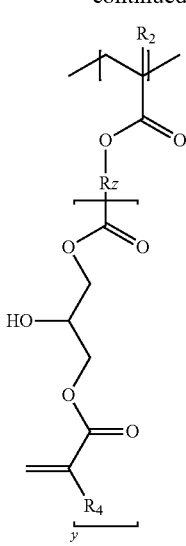

Wherein, $R_1$ represents hydrogen, or a radical, which forms an imide structure or a five-membered cyclic carboxylic anhydride with $R_x$, $R_2$ is methyl and $R_3$ is selected from the group consisting of hydrogen, methyl and hydroxyl methyl, $R_4$ represents hydrogen or a methyl group, $R_x$ is selected from the group consisting of $C_1$ to $C_{12}$ alkyl esters, $C_2$ to $C_6$ alkyl esters substituted with 1 or 2 hydroxy groups, $C_2$ to $C_6$ alkyl esters substituted with $C_1$ to $C_3$ alkoxy groups, $C_1$ to $C_6$ alkyl esters substituted with halogen groups, $C_1$ to $C_3$ alkoxy poly(n=2 to 30) alkylene, $C_2$ to $C_3$ glycol esters, $C_1$ to $C_6$ alkyl esters substituted with phenyl groups, phenyl substituted with $C_1$ to $C_6$ alkyl groups, phenyl substituted with $C_1$ to $C_6$ alkoxy groups, phenyl substituted with halogen groups, $C_i$ to $C_6$ alkoxy methyl groups, glycidoxy methyl group, $C_5$ to $C_{15}$ cyclic alkyl esters, $C_6$ to $C_{12}$ aromatic groups, and a radical that forms an imide structure or a five-membered cyclic carboxylic anhydride together with $R_1$, $R_Z$ is obtained by the reaction product of the hydroxyl group of a polyethyleneglycol monomethacrylate with a carboxylic anhydride and represents a part of the reaction product of the anhydride and the —OH of the polyethyleneglycol monomethacrylate, and X represents 1 to 4, and y represents 1 to 3.

2. The colored dispersion according to claim 1, wherein the anhydride used for preparing $R_Z$ is selected from the group consisting of succinic anhydride, methyl succinic anhydride, 2,2-dimethyl succinic anhydride, isobutenyl succinic anhydride, 1,2-cyclohexane dicarboxlic anhydride, hexahydro-4-methyl phthalic anhydride, itaconic anhydride, tetrahydro phthalic anhydride, 5-norbornene-2,3-dicarboxylic anhydride, methyl-5-norbornene -2,3-dicarboxylic anhydride, 1,2,3,4-cyclobutanetetracarboxylic dianhydride, maleic anhydride, citraconic anhydride, 2,3-dimethylmaleic anhydride, 1-cyclopentene-1,2-dicarboxylic dianhydride, 3,4,5,6-tetrahydrophthalic anhydride, phthalic anhydride, 4-methylphthalic anhydride, 3,6-dichlorophthalic anhydride, 3-hydrophthalic anhydride, 1,2,4-benzenetricarboxylic anhydride, and 4-nitrophthalic anhydride.

3. The colored dispersion according to claim 1, wherein the binder resin has a weight-average molecular weight in a range of 5000 to 100000 and an acid value in a range of 10 to 300.

4. The colored dispersion according to claim 1, wherein the pigment is prepared by mixing carbon black with one or more coloring pigments selected from the groups consisting of phthalocyanine green, phthalocyanine blue, perylene black, cyanine black, linol yellow, benzidine yellow, victoria pure blue, a white pigment and a fluorescent pigment.

5. The colored dispersion according to claim 1, wherein at least one first monomer having the structure of Formula 1 is selected from the group consisting of benzyl(meth)acrylate, methyl(meth)acrylate, ethyl(meth)acrylate, butyl(meth)acrylate, isobutyl(meth)acrylate, t-butyl(meth)acrylate, cyclohexyl(meth)acrylate, isobornyl(meth)acrylate, ethylhexyl (meth)acrylate, 2-phenoxyethyl(meth)acrylate, tetrahydrofurfuryl(meth)acrylate, 2-methoxyethyl(meth) acrylate, 3-methoxybutyl(meth)acrylate, ethoxydiethyleneglycol(meth)acrylate, methoxytriethyleneglycol(meth)acrylate, methoxytripropyleneglycol(meth)acrylate, poly (ethyleneglycol)methylether(meth)acrylate, phenoxydiethyleneglycol(meth)acrylate, p-nonylphenoxypolyethylenegylcol(meth)acrylate, p-nonylphenoxypolypropyleneglycol (meth)acrylate, glycidyl(meth)acrylate, tetrafluoropropyl(meth)acrylate, 1,1,1,3,3,3-hexafluoroisopropyl(meth)acrylate, octafluoropentyl(meth) acrylate, heptadecafluorodecyl(meth)acrylate, tribromophenyl(meth)acrylate, dicyclopentanylmethacrylate, dicyclopentenylmethacrylate, dicyclopentenyloxyethylacrylate, isobornylmethacrylate, adamantylmethacrylate, methyl α-hydroxymethyl acrylate, ethyl α-hydroxymethyl acrylate, propyl α-hydroxymethyl acrylate, butyl α-hydroxymethyl acrylate, styrene, α-methylstyrene, (o,m,p)-vinyl toluene, (o,m,p)-methoxy styrene, (o,m,p)-chloro styrene, vinyl methyl ether, vinyl ethyl ether, N-phenyl maleimide, N-(4-chlorophenyl) maleimide, N-(4-hydroxyphenyl) maleimide, N-cyclohexyl maleimide, maleic anhydride, and methyl maleic anhydride.

6. A photoresist composition, comprising:
the colored dispersion of claim 1;
an alkali-soluble resin binder;
a multifunctional monomer selected from the group consisting of polyethylene glycol(meth)acrylate, polypropylene glycol(meth)acryatle, trimethylol ethane triacrylate, trimethylol propane triacrylate, neopentyl glycol (meth)acrylate, pentaerythritol tetraacrylate, pentaerythritol triacrylate, dipentaerythritol pentaacrylate, and dipentaerythritol hexaacrylate;
a photopolymerization initiator; and
a solvent.

7. The photoresist composition according to claim 6, wherein the entire photoresist composition comprises 20 to 60% by weight of the colored dispersion, 1 to 20% by weight of the alkali-soluble resin binder, 1 to 20% by weight of the multifunctional monomer, 0.1 to 20% by weight of the photopolymerization initiator and 30 to 77.9% by weight of the solvent.

8. The photoresist composition according to claim 6, wherein the alkali-soluble resin binder consists of monomers which are at least one selected from the group consisting of: benzyl(meth)acrylate, methyl(meth)acrylate, ethyl(meth)acrylate, butyl(meth)acrylate, dimethylaminoethyl(meth)acrylate, isobutyl(meth)acrylate, t-butyl(meth)acrylate, cyclohexyl(meth)acrylate, isobornyl(meth)acrylate, ethylhexyl(meth)acrylate, 2-phenoxyethyl(meth)acrylate, tetrahydrofurfuryl(meth)acrylate, hydroxyethyl(meth)acrylate, 2-hydoxypropyl(meth)acrylate, 2-hydroxy-3-chloropropyl(meth)acrylate, 4-hydroxybutyl(meth)acrylate, acyloctyloxy-2-hydroxypropyl(meth)acrylate, glycerol(meth)acrylate, 2-methoxyethyl(meth)acrylate, 3-methoxybutyl(meth)acrylate, ethoxydiethyleneglycol(meth)acrylate, methoxytriethyleneglycol(meth)acrylate, methoxytripropyleneglycol(meth)acrylate, poly(ethyleneglycol)methylether(meth)acrylate, phenoxydiethyleneglycol(meth)acrylate, p-nonylphenoxypolyethyleneglycol(meth)acrylate, p-nonylphenoxypolypropyleneglycol(meth)acrylate, glycidyl(meth)acrylate, tetrafluoropropyl(meth)acrylate, 1,1,1,3,3,3-hexafluoroisopropyl(meth)acrylate, octafluoropentyl(meth)acrylate, heptadecafluorodecyl(meth)acrylate, tribromophenyl(meth)acrylate, dicyclopentanylmethacrylate, dicyclopentenylmethacrylate, dicyclopentenyloxyethylacrylate, isobornylmethacrylate, adamantylmethacrylate, methyl α-hydroxymethyl acrylate, ethyl α-hydroxymethyl acrylate, propyl α-hydroxymethyl acrylate, butyl α-hydroxymethyl acrylate, styrene, α-methylstyrene, (o,m,p)-vinyl toluene, (o,m,p)-methoxy styrene, (o,m,p)-choloro styrene, vinyl methyl ether, vinyl ethyl ether, aryl glycidyl ether, N-phenyl maleimide, N-(4-chlorophenyl) maleimide, N-(4-hydroxyphenyl) maleimide, N-cyclohexyl maleimide, maleic anhydride, and methyl maleic anhydride; and monomers which are at least one selected from the group consisting of crotonic acid, itaconic acid, maleic acid, fumaric acid, monomethyl maleic acid, 5-norbornene-2-carboxylic acid, mono-2-((meth)acryloyloxy)ethyl phthalate, mono-2-((meth)acryloyloxy)ethyl succinate, and ω-carboxy polycaprolactone mono(meth)acrylate, or wherein the alkali-soluble rein binder is represented by the following formula:

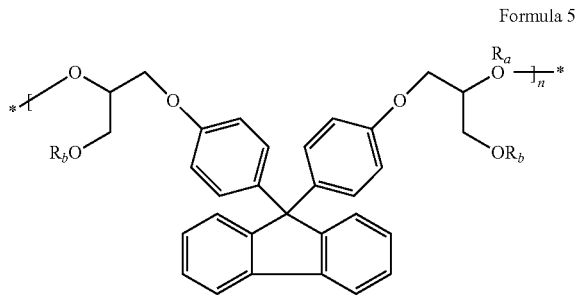

Formula 5 wherein $R_a$ represents a five-membered cyclic carboxylic anhydride or has a structure, which forms combinations by the addtional reaction of diisocyanate, and $R_b$ is selected from the group consisting of hydrogen, acryloyl, and methacrylol.

9. A black matrix prepared by the photoresist composition of claim 8.

10. The photoresist composition according to claim 6, wherein the photopolymerization initiator is one or more compounds selected from the group consisting of acetophenone compounds, biimidazole compounds, triazine compounds and oxime compounds.

11. A black matrix prepared by the photoresist composition of claim 10.

12. The photoresist composition according to claim 6, further comprising a photo crosslinking accelerator or a hardener.

13. The photoresist composition according to claim 12, further comprising an adhesion promoter.

14. A black matrix prepared by the photoresist composition of claim 13.

15. A black matrix prepared by the photoresist composition of claim 12.

* * * * *